United States Patent [19]
Jang

[11] Patent Number: 5,195,141
[45] Date of Patent: Mar. 16, 1993

[54] DIGITAL AUDIO EQUALIZER

[75] Inventor: Seong-Cheol Jang, Suweon, Rep. of Korea

[73] Assignee: Samsung Electronics Co., Ltd., Suwon, Rep. of Korea

[21] Appl. No.: 715,647

[22] Filed: Jun. 14, 1991

[30] Foreign Application Priority Data

Aug. 9, 1990 [KR] Rep. of Korea ............... 90-12211

[51] Int. Cl.$^5$ .......................... H03G 5/00; H03G 3/00
[52] U.S. Cl. ........................................ 381/103; 381/63
[58] Field of Search ................ 381/98, 103, 63, 1, 381/17, 381

[56] References Cited

U.S. PATENT DOCUMENTS

| | | | |
|---|---|---|---|
| 4,661,982 | 4/1987 | Kitazato et al. | 381/103 |
| 4,706,291 | 11/1987 | Kakubo et al. | 381/63 |
| 4,893,316 | 1/1990 | Janc et al. | 375/77 |
| 4,991,218 | 2/1991 | Kramer | 381/61 |
| 5,016,280 | 5/1991 | Engebretson et al. | 381/68.2 |
| 5,091,951 | 2/1992 | Ida et al. | 381/63 |

Primary Examiner—James L. Dwyer
Assistant Examiner—Jack Chiang
Attorney, Agent, or Firm—Robert E. Bushnell

[57] ABSTRACT

There is disclosed a digital audio equalizer comprising an analog/digital (A/D) converter for converting an analog audio signal into a digital audio data, a digital interface receiver for demodulating the digital data that have been modulated into a digital audio interface format into the original audio data, a signal input select switch for selecting one of the outputs of the A/D converter and digital interface receiver, a digital signal processor for receiving the output of the signal input select switch to digitally process equalizing function, a microcomputer for controlling the digital signal processor, a key input circuit for controlling the operation of the microcomputer, a state display circuit for displaying the parameters of the equalizer, and a digital/analog (D/A) converter for converting the digital output signals of the digital signal processor into analog audio signals.

10 Claims, 5 Drawing Sheets

DIGITAL AUDIO EQUALIZER

TECHNICAL BACKGROUND

The present invention concerns a digital audio equalizer. The conventional equalizer for controlling the amplitude characteristics of a given frequency in an audio signal tends to degrade the sound quality because of the deviation of the characteristics of analog element such as resistance, condenser, etc. Besides, since the characteristics of the analog elements have a given value, it is impossible to adjust the characteristics of each equalizer to the requirements of the user. There is disclosed in U.S. Pat. No. 4,661,982 a digital audio equalizer related to the present invention.

SUMMARY OF THE INVENTION

The object of the present invention is to provide a digital audio equalizer with high freedom that employs a digital signal processor for carrying out digital filter function to make equalization, so that its characteristics are considerably improved compared to the analog audio equalizer, and the user may arbitrarily change the characteristics.

According to the present invention, a digital audio equalizer comprises an analog/digital (A/D) converter for converting an analog audio signal into a digital audio data, a digital interface receiver for demodulating the digital data that have been modulated into a digital audio interface format into the original audio data, a signal input select switch for selecting one of the outputs of the A/D converter and digital interface receiver, a digital signal processor for receiving the output of the signal input select switch to digitally process equalizing function, a microcomputer for controlling the digital signal processor, a key input circuit for controlling the operation of the microcomputer, a state display circuit for displaying the parameters of the equalizer, and a digital/analog (D/A) converter for converting the digital output signals of the digital signal processor into analog audio signals.

The present invention will now be described more specifically with reference to the drawings attached only by way of example.

DETAILED DESCRIPTION OF A CERTAIN PREFERRED EMBODIMENT

Figure 1:
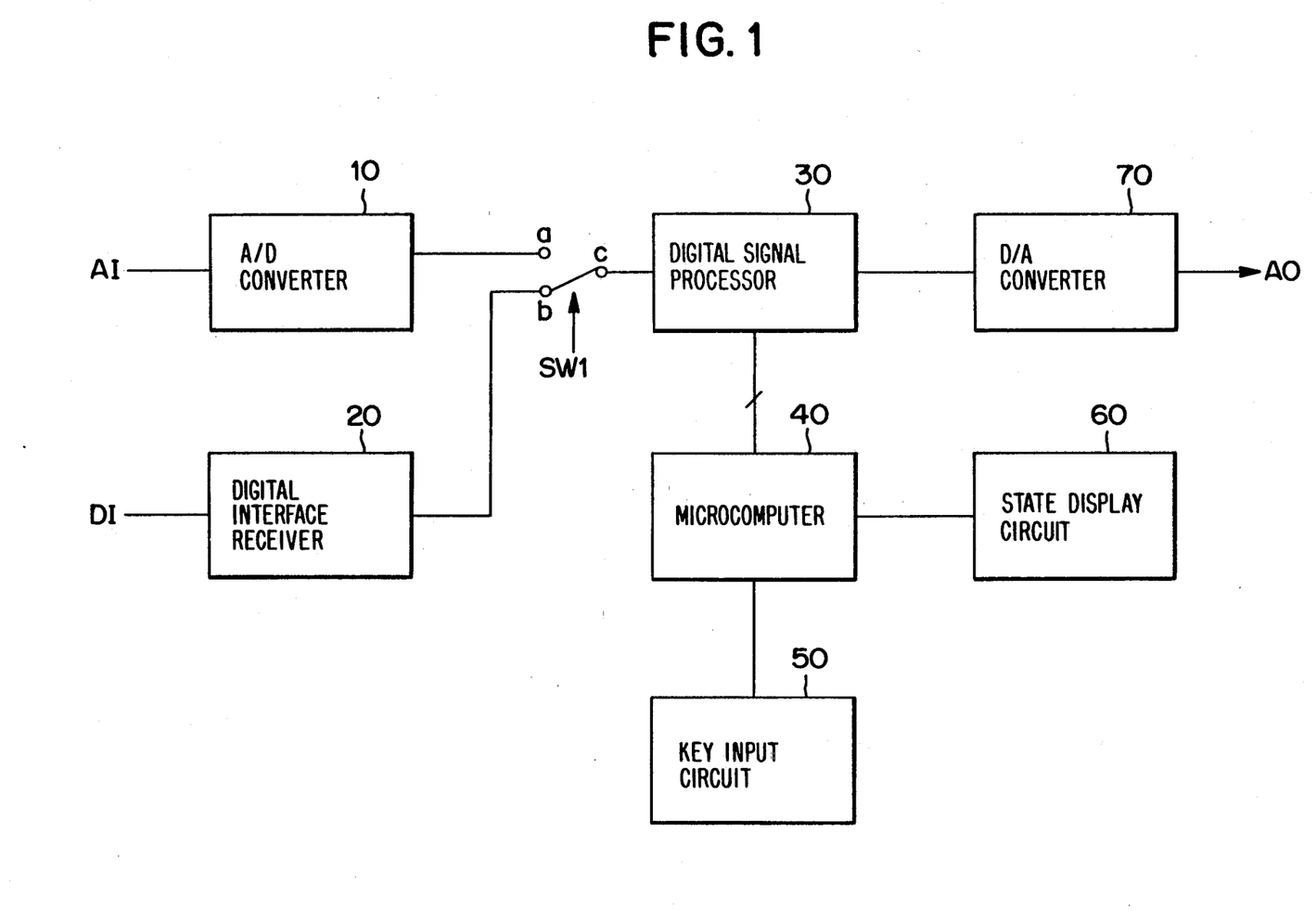
FIG. 1 is a block diagram for illustrating the inventive circuit.

An analog/digital (A/D) converter 10 converts an analog audio signal into a digital audio data. A digital interface receiver 20 demodulates the digital data that have been modulated into a digital audio interface format into the original audio data. A signal input select switch (SW1) selects one of the outputs of the A/D converter 10 and digital interface receiver 20. A digital signal processor 30 receives the output of the signal input select switch (SW1) to digitally process equalizing function. A microcomputer 40 controls the digital signal processor 30. A key input circuit 50 controls the operation of the microcomputer 40. A state display circuit 60 displays the parameters of the equalizer. A digital/analog (D/A) converter 70 converts the digital output signals of the digital signal processor 30 into analog audio signals.

Figure 2:
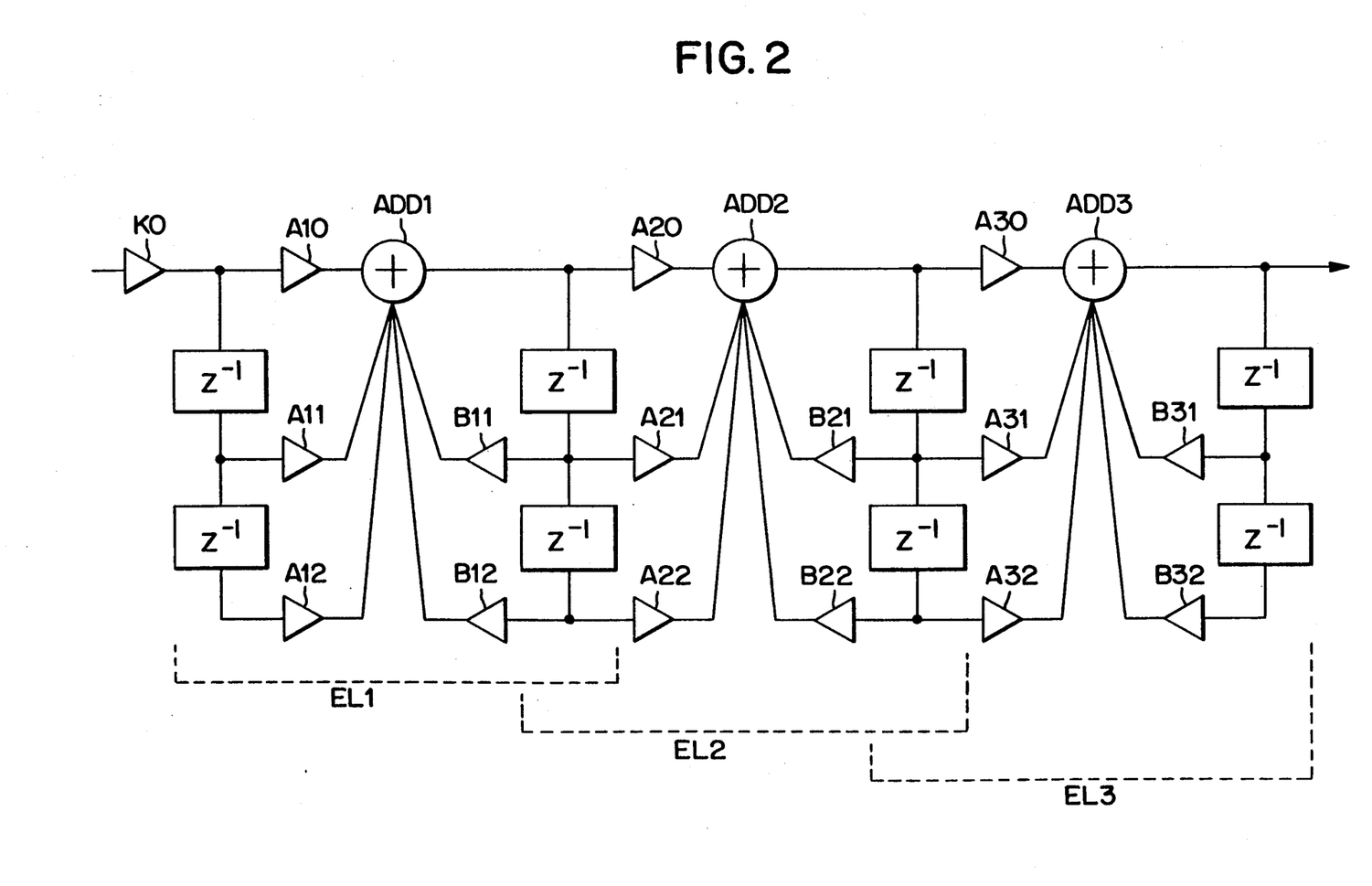
FIG. 2 illustrates the internal algorithm of the digital signal processor shown in FIG. 1.

Referring to FIG. 2, there are shown first, second and third digital equalizer bands EL1, EL2 and EL3. K0 represents multiplier for dampening the input signal. A10, A11, A12, B11 and B12 represent multipliers for the first digital equalizer band. A20, A21, A22, B21 and B22 represent multipliers for the second digital equalizer band. A30, A31, A32, B31 and B32 represent multipliers for the third equalizer band. $Z^{-1}$ represents one sample delay.

Figure 3:
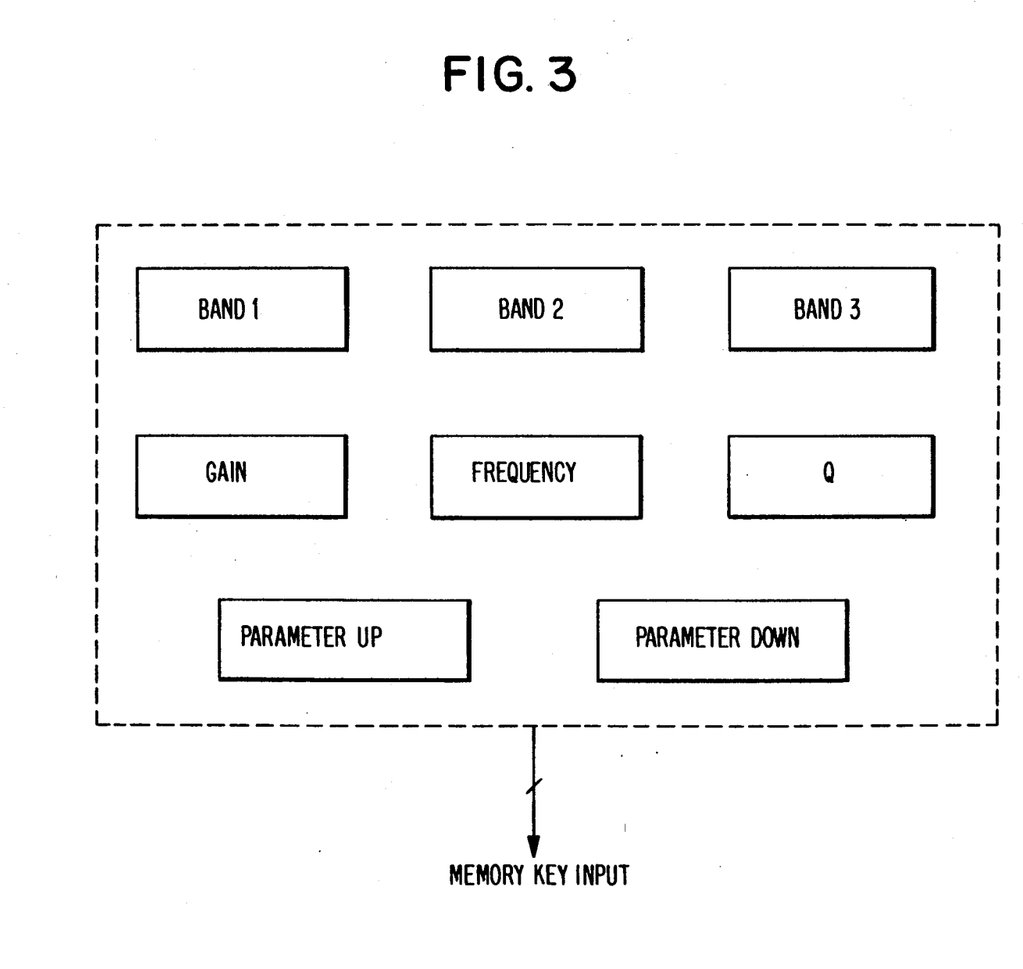
FIG. 3 is a schematic diagram of the key input part shown in FIG. 1.

Referring to FIG. 3, BAND1 represents the switch for selecting the first digital equalizer band, BAND2 the witch for selecting the second digital equalizer band, BAND3 the switch for selecting the third digital equalizer band, GAIN the switch for controlling the gain parameters of the equalizer, FREQUENCY the switch for controlling the center frequency of the equalizer, Q the switch for controlling the quality of the equalizer, PARAMETER UP the switch for increasing the parameters of the equalizer, and PARAMETER DOWN the switch for dampening the parameters of the equalizer.

In operation, the analog input signal AI is converted into digital audio data through the A/D converter 10, while the digital audio data DI of digital audio interface format is transformed into the original digital audio data through the digital interface receiver 20. One of the output signals of the A/D converter 10 and digital interface receiver 20 is delivered to the digital signal processor (DSP) 30 by the signal input select switch SW1. The DSP 30 performs the equalizer operation with the data from the microcomputer 40, which is controlled by the key input part 50 operated by the user. The operational state of the microcomputer is displayed on the state display circuit 60. Meanwhile, the digital audio data signal of the DSP 30 is converted into an analog signal A0 through the D/A converter 70. More specific description of the inventive circuit will now be made with reference to the DSP 30.

The digital audio equalizer according to the present invention accomplishes the processing of the digital signal by means of the algorithm as shown in FIG. 2. The present embodiment of digital audio equalizer includes three bands each comprising secondary infinite impulse response filter (IIR filter). Namely, secondary IIR filters are cascaded in three stages of the first, second and third equalizer bands EL1, EL2 and EL3. In other words, each of the three equalizer bands EL1, EL2 and EL3 is a secondary IIR digital filter performing the same kind of operation that, in the example of the first equalizer band EL1, consists of five multipliers A10, A11, A12, B11 and B12, an adder ADD1, and four delay means $Z^{-1}$, and whose transfer function in the digital region is expressed by the following Equation (1).

$$H_1(Z) = \frac{A_{10} + A_{11} \cdot Z^{-1}}{1 - B_{11} \cdot Z^{-1} - B_{12} \cdot Z^{-2}} \quad (1)$$

Wherein $Z^{-1}$ represents one sample delay, and $Z^{-2}$ two samples delay.

The transfer functions of the second and third equalizer bands EL2 and EL3 in the digital region are respectively expressed by the following Equations (2) and (3).

$$H_2(Z) = \frac{A_{20} + A_{21} \cdot Z^{-1} + A_{22} \cdot Z^{-2}}{1 - B_{21} \cdot Z^{-1} - B_{12} \cdot Z^{-2}} \quad (2)$$

$$H_3(Z) = \frac{A_{30} + A_{31} \cdot Z^{-1} + A_{22} \cdot Z^{-2}}{1 - B_{31} \cdot Z^{-1} - B_{32} \cdot Z^{-2}} \quad (3)$$

According to the above Eqs. (1) to (3), the whole transfer function of the algorithm shown in FIG. 2 is expressed by the following Equation (4).

$$H_T(Z) = K_0 \cdot H_1(Z) \cdot H_2(Z) \cdot H_3(Z) = \quad (4)$$

$$K_0 \cdot T^3 \frac{A_{R0} + A_{R1} \cdot Z^{-1} + A_{R2} \cdot Z^{-2}}{1 - B_{R1} \cdot Z^{-1} - B_{R2} \cdot Z^{-2}}$$

Wherein K0 represents the multiplying coefficient for dampening the input signal.

The inventive algorithm of Eq. (4) is formed by the three secondary digital IIR filters cascaded, where each of the stages $H_1(Z)$, $H_2(Z)$, $H_3(Z)$ is operated under the same principle. Thus, in reference to the transfer function $H_1(Z)$ of the first equalizer band EL1, the five multipliers A10, A11, A12, B11, B12 should have given values to represent the equalizer characteristics in order that the secondary digital IIR filter of Eq. (1) serves as the equalizer. The multiplying coefficients to represent the equalizer characteristics may be deduced from the transfer function of the analog region. The transfer function of the analog prototype filter to represent the equalizer characteristics is expressed by the following Equations (5) and (6).

$$H(S) = \frac{S^2 + \frac{GW_a}{Q} S + W_a^2}{S^2 + \frac{W_a}{Q} S + W_a^2} \quad (5)$$

$$H(S) = \frac{S^2 + \frac{W_a}{Q} S + W_a^2}{S^2 + \frac{GW_a}{Q} S + W_a^2} \quad (6)$$

Eqs. (5) and (6) respectively represent the transfer function in the analog region at the peak characteristics (when the equalizer characteristics are boosted), and the transfer function in the analog region at the deep characteristics (when the equalizer characteristics are cut). In this case, the parameter G indicates the gain of the equalizer, Q the quality factor, and Wa the angular frequency.

The transfer function in the analog region is transformed into the transfer function in the digital region by using bilinear transform. In order to do this, the points on the S-plane (analog region) may be mapped by the corresponding points on the Z-plane (digital region) using the following transformational Equation (7).

$$S = \frac{1}{T} \cdot \frac{1 - Z^{-1}}{1 + Z^{-1}} \quad (7)$$

Wherein the parameter T represents the sampling period.

When doing the bilinear transform, the frequency warping should be considered. Namely, assuming Wa, Wd and Ws respectively represent the frequency in the analog region, the frequency in the digital region and the sampling frequency, the frequency band $0 < W_a < 1$ of the analog region frequency corresponds with the frequency band $0 < W_d < W_s/4$, while the infinite frequency band $W_a > 1$ compressedly corresponds with $W_s/4 < W_d < W_s/2$. Namely, Wa=0 is mapped to Wd=0, whereas Wa=infinite band is mapped to Wd=Ws/2. When using the bilinear transform, this phenomenon should be considered compensated by the following Equation (8).

$$\frac{TW_a}{2} = \text{TAN} \frac{TW_d}{2} \quad (8)$$

In order to transform the transfer function of the equalizer in the analog region into the transfer function of the equalizer in the digital region, the transformational Eq. (7) is put into Eqs. (5) and (6), thus obtaining the following Equations (9) and (10).

Eqs. (9) and (10) respectively represent the transfer functions of the digital region equalizer of the peak and deep characteristics.

$$H(Z) = \frac{\frac{4}{T^2} \cdot \frac{(1 - Z^{-1})^2}{(1 - Z^{-1})^2} + 2 \frac{GW_a}{Qt} \cdot \frac{1 - Z^{-1}}{1 + Z^{-1}} + 1 W_a^2}{\frac{4}{T^2} \cdot \frac{(1 - Z^{-1})^2}{(1 + Z^{-1})^2} + 2 \frac{W_a}{QT} \cdot \frac{1 - Z^{-1}}{1 + Z^{-1}} + W_a^2} \quad (9)$$

$$H(Z) = \frac{\frac{4}{T^2} \cdot \frac{(1 + Z^{-1})^2}{(1 + Z^{-1})^2} + 2 \frac{W_a}{QT} \cdot \frac{1 - Z^{-1}}{1 + Z^{-1}} + W_a^2}{\frac{4}{T^2} \cdot \frac{(1 - Z^{-1})^2}{(1 + Z^{-1})^2} + 2 \frac{GW_a}{QT} \cdot \frac{1 - Z^{-1}}{1 + Z^{-1}} + W_a^2} \quad (10)$$

Assuming $$T_x = \frac{TW_a}{2} = \text{TAN}\left(\frac{TW_d}{2}\right),$$

Eq. (8) is put into Eqs. (9) and (10), thus obtaining the following Equations (11) and (12).

$$H(Z) = \frac{\frac{1 + \frac{GT_x}{Q} + T_x^2}{1 + \frac{T_x}{Q} + T_x^2} + \frac{2T_x^2 - 2}{1 + \frac{T_x}{Q} + T_x^2} \cdot Z^{-1} + \frac{1 - \frac{GT_x}{Q} + T_x^2}{1 + \frac{T_x}{Q} + T_x^2} \cdot Z^{-2}}{1 \cdot \frac{2 - 2T_x^2}{1 + \frac{T_x}{Q} + T_x^2} \cdot Z^{-1} + \frac{\frac{T_x}{Q} - 1 - T_x^2}{1 + \frac{T_x}{Q} + T_x^2} \cdot Z^{-2}} \quad (11)$$

$$H(Z) = \frac{\frac{1 + \frac{Tx}{G} + Tx^2}{1 + \frac{GTx}{Q} + Tx^2} + \frac{2Tx^2 - 2}{1 + \frac{GTx}{Q} + Tx^2} \cdot Z^{-1} + \frac{1 - \frac{Tx}{G} + Tx^2}{1 + \frac{GTx}{Q} + Tx^2} \cdot Z^{-2}}{1 - \frac{2 - 2Tx^2}{1 + \frac{GTx}{Q} + Tx^2} \cdot Z^{-1} + \frac{\frac{GTx}{Q} - 1 - Tx^2}{1 + \frac{GTx}{Q} + Tx^2} \cdot Z^{-2}} \quad (12)$$

Comparing Eq. (1) with Eqs. (11) and (12), the coefficient of the secondary IIR digital filter representing the equalizer characteristics is obtained by the following procedure.

Firstly, the coefficients of the filter representing the peak characteristics are expressed by the following Equations (13) to (17).

$$A10 = \frac{1 + \frac{GTx}{Q} + Tx^2}{1 + \frac{Tx}{Q} + Tx^2} \quad (13)$$

$$A11 = \frac{2Tx^2 - 2}{1 + \frac{Tx}{Q} + Tx^2} \quad (14)$$

$$A12 = \frac{1 - \frac{GTx}{Q} + Tx^2}{1 + \frac{Tx}{Q} + Tx^2} \quad (15)$$

$$B11 = \frac{2 - 2Tx^2}{1 + \frac{Tx}{Q} + Tx^2} \quad (16)$$

$$B12 = \frac{\frac{Tx}{Q} - 1 - Tx^2}{1 + \frac{Tx}{Q} + Tx^2} \quad (17)$$

In Eq. (8), since the digital region frequency Wd is the center frequency Wo of the equalizer, the following Equation (18) is obtained.

$$Tx = \text{TAN}\left(\frac{TWd}{2}\right) = \text{TAN}\left(\frac{TWo}{2}\right) = \text{TAN}\left(\pi \cdot \frac{Fo}{Fs}\right) \quad (12)$$

Wherein $v = 3.14159265$, Fo the center frequency, Fs the sampling frequency.

If the parameter G in Eqs. (13) to (17) is converted into decibel (dB) form used in the audio system, the following Equations (19) to (24) are obtained.

$$A10 = \frac{1 + \frac{KTx}{Q} + Tx^2}{1 + \frac{Tx}{Q} + Tx^2} \quad (19)$$

$$A11 = \frac{2Tx^2 - 2}{1 + \frac{Tx}{Q} + Tx^2} \quad (20)$$

$$A12 = \frac{1 - \frac{KTx}{Q} + Tx^2}{1 + \frac{Tx}{Q} + Tx^2} \quad (21)$$

$$B11 = \frac{2 - 2Tx^2}{1 + \frac{Tx}{Q} + Tx^2} \quad (22)$$

$$B12 = \frac{\frac{Tx}{Q} - 1 - Tx^2}{1 + \frac{Tx}{Q} + Tx^2} \quad (23)$$

$$K = 10 \left| \frac{G}{20} \right| \quad (24)$$

The coefficients of the filter representing the deep characteristics are expressed by the following Equations (25) to (29).

$$A10 = \frac{1 + \frac{Tx}{Q} + Tx^2}{1 + \frac{GTx}{Q} + Tx^2} \quad (25)$$

$$A11 = \frac{2Tx^2 - 2}{1 + \frac{GTx}{Q} + Tx^2} \quad (26)$$

$$A12 = \frac{1 - \frac{Tx}{Q} + Tx^2}{1 + \frac{GTx}{Q} + Tx^2} \quad (27)$$

$$B11 = \frac{2 - 2Tx^2}{1 + \frac{GTx}{Q} + Tx^2} \quad (28)$$

$$B12 = \frac{\frac{GTx}{Q} - 1 - Tx^2}{1 + \frac{GTx}{Q} + Tx^2} \quad (29)$$

If the parameter G in Eqs. (25) to (29) is converted into dB form, the following Equations (30) to (34) are obtained.

$$A10 = \frac{1 + \frac{Tx}{Q} + Tx^2}{1 + \frac{KTx}{Q} + Tx^2} \quad (30)$$

$$A11 = \frac{2Tx^2 - 2}{1 + \frac{KTx}{Q} + Tx^2} \quad (31)$$

$$A12 = \frac{1 + \frac{Tx}{Q} + Tx^2}{1 + \frac{KTx}{Q} + Tx^2} \quad (32)$$

$$B11 = \frac{2 - 2Tx^2}{1 + \frac{KTx}{Q} + Tx^2} \quad (33)$$

$$B12 = \frac{\frac{KTx}{Q} - 1 - Tx^2}{1 + \frac{KTx}{Q} + Tx^2} \quad (34)$$

The inventive digital audio equalizer has the following specifications.

*1. Number of Equalizer Bands: Three (BAND1, BAND2, BAND3)

*2. Range of Variable Center Frequency Gain: +12 dB–12 dB, 1 dB Step.
*3. Center Frequency: 28 Point(20 Hz–20 KHz, 1/30 CT Step) 32, 40, 50, 63, 80, 100, 125, 160, 200, 250, 315, 400, 500, 630, 800, 1K, 1.2K, 106K, 2K, 2.5K, 3.2K, 4K, 4.5K, 5K, 6.3K, 8K, 10K, 12K, 16K (Hz)
*4. Quality Factor (Q): 0.7, 1.4, 3.0, 6.0
*5. Sampling Frequency: 32K/44.1K/48K (Hz)

Thus, in accordance with the present invention, there is obtained a parametric equalizer that the center frequency, center frequency gain and quality factor (Q) may be established for each of the three bands, for example, 100 Hz, −2 dB and 1.4 for the first equalizer band, 500 Hz, +4 dB and 6.0 for the second equalizer band, and 8 KHz, +8 db and 3.0 for the third equalizer band, by using the data supplied from the microcomputer 40 to DSP 30 by the operation of the key input part 50.

Considering the characteristics of the above example, the first band has the deep characteristics because of the center frequency gain being −2 dB. Therefore, if the sampling frequency Fs is 44.1 KHz, the coefficients A10, A11, A12, B11 and B12 of the first band are given by Eqs. (30) to (34) as follows:
A10=0.998796643
A11=−1.988127937
A12=0.989501636
B11=1.988127937
B12=−0.988298279

These coefficients respectively are transferred to the multipliers A10 to B12 of the first equalizer band EL1 in the algorithm of FIG. 2.

The second band has the peak characteristics because of the center frequency gain being +4 dB. Therefore, if the sampling frequency Fs is 44.1 KHz, the coefficients A20, A21, A22, B21 and B22 of the second band are given by Eqs. (19) to (24) as follows:
A20=1.00317054
A21=−1.984899626
A22=0.985988027
B21=1.984899626
B22=−0.989158567

These coefficients respectively transferred to the multipliers A20–B22 of the second equalizer band EL2 in the algorithm of FIG. 2.

The third band has the peak characteristics because of the center frequency gain being +8 dB. Therefore, if the sampling frequency Fs is 44.1 KHz, the coefficients A30, A31, A32, B31 and B32 of the third band respectively are given by Eqs. (19)–(24) as follows:
A30=1.198830154
A31=−0.725657028
A32=0.538147229
B31=0.725657028
B32=−0.736977382

These coefficients respectively are transferred to the multipliers A30–B32 of the third equalizer band EL3 in the algorithm of FIG. 2.

Figure 4:
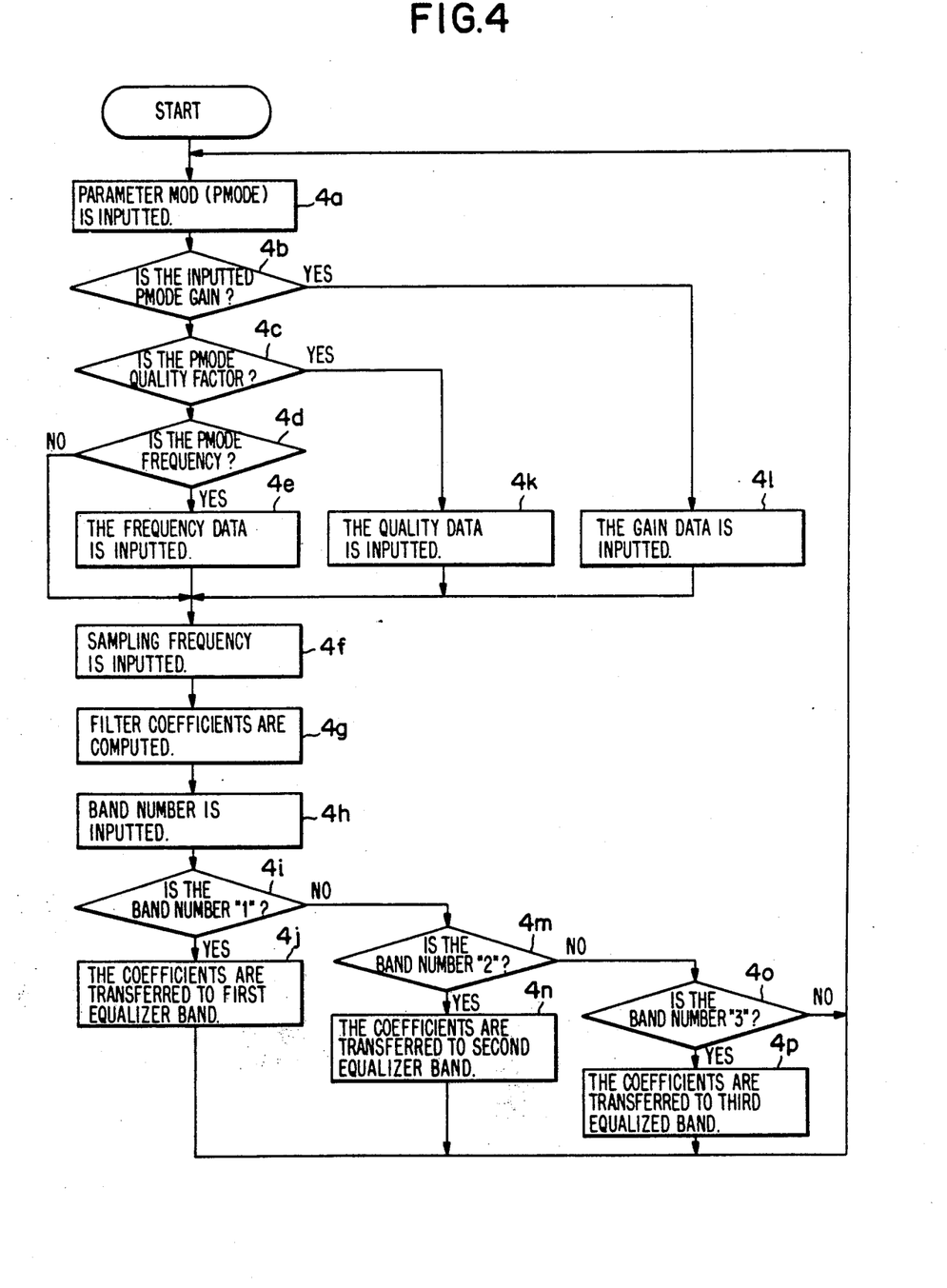
FIG. 4 is a flow chart for illustrating the computing of parameters and the sequence of signal transfer according to the present invention.

The coefficients are transferred from the microcomputer 40 to DSP 30 following the sequence of FIG. 4. According to the present invention, the values of Tx are classified according to Fo and Fs, and stored into ROM of the microcomputer 40. Hence, if Fo and Fs is known, the Tx may be read out from the internal ROM by the address found out from the look-up table of the ROM. In the present embodiment, since the number of the center frequencies Fo is twenty-eight, the number of the sampling frequencies Fs three, the look-up table has eighty-four values of the Tx. The state of each parameter of the equalizer is displayed on the state display means 60 for the user to note the operational state.

The computation and transferring sequence of the coefficients by the microcomputer 40 will now be described with reference to FIG. 4. It is checked out in step 4b whether or not the parameter mode PMODE inputted in step 4a is gain. If the mode is gain, the gain data is inputted by the user through the key input part 50 in step 4l, whereas, if the mode is not gain, it is checked out in step 4c whether or not the mode is quality factor. If the mode indicates the quality, the quality data is inputted by the user through the key input part 50 in step 4k, whereas, if the mode does not indicate the quality factor, it is checked out in step 4d whether or not the mode is frequency. If the mode indicates frequency, the frequency data is inputted in step 4e.

After inputting each corresponding data in steps 4e, 4k and 4l, or if the mode does not indicate frequency in step 4d, the sampling frequency is inputted in step 4f.

Then, the filter coefficients are computed in step 4g, and the band number is inputted in step 4h. If the band number is checked out as "1" in step 4i, the coefficients are transferred to the first equalizer band in step 4j, and the processing sequence is looped to the step 4a. However, if the band number is not checked out as "1" in the step 4i, it is again checked out in step 4m whether or not the band number is "2". If the band number is checked out as "2", the coefficients are transferred to the second equalizer band in step 4n, and the processing sequence is looped to the step 4a. However, if the band number is not checked out as "2", it is again checked out in step 4o whether the band number is "3". If the band number is checked out as "3", the coefficients are transferred to the third equalizer band in step 4p. After carrying out the step 4p, or if the band number is not checked out as "3" in the step 4o, the processing sequence is looped to the step 4a. Meanwhile, the computation of the filter coefficients in step 4g is accomplished according to the sequence as shown in the flow chart of FIG. 5.

Figure 5:
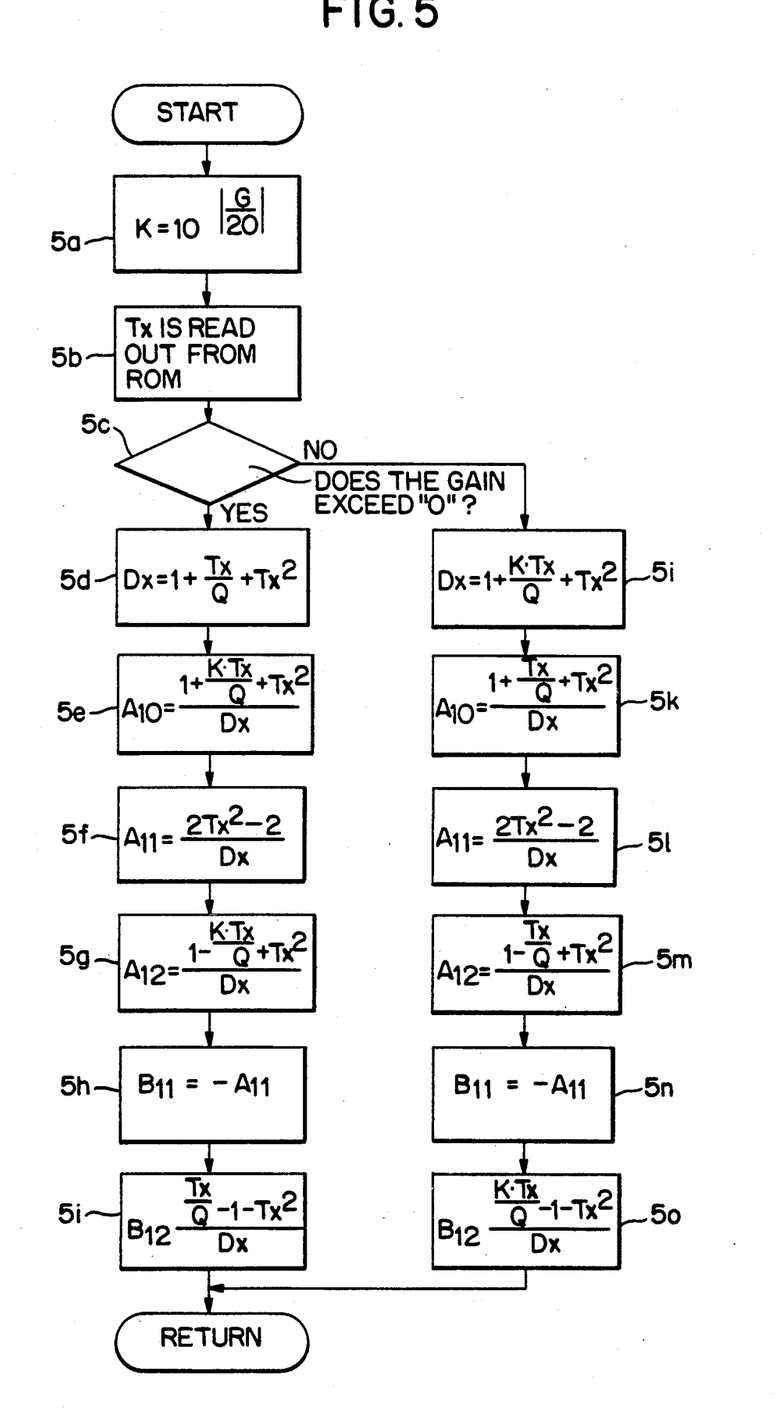
FIG. 5 is a flow chart for illustrating the computing of the filter parameters according to the present invention.

Describing the computation of the filter coefficients with reference to FIG. 5, the parameter K is assumed to have $$"10^{\left|\frac{G}{20}\right|}"$$

in step 5a, and the Tx of Eq. (18) determined according to the center frequency Fo and sampling frequency Fs in step 5b is read out from the internal ROM of the microcomputer 40 by the address found out from the look-up table.

Then, it is checked out in step 5c whether or not the gain exceeds "0". If the gain exceeds "0", the Equation $$1 + \frac{Tx}{Q} + Tx^2$$

is operated in step 5d to find the value of Dx, and the Equation $$\frac{1 + K \cdot \frac{Tx}{Q} + Tx^2}{Dx}$$

is operated in step 5e to find the value of A10. Thereafter, the Equation $$\frac{2Tx^2 - 2}{Dx}$$

is operated in step 5f to find the value of A11, and the Equation $$\frac{1 - K \cdot \frac{Tx}{Q} + Tx^2}{Dx}$$

is operated in step 5g to find the value of A12. In step 5h, the value of A11 is caused to take the negative sign so as to produce the value of B11.

Finally, the Equation $$\frac{\frac{T1}{Q} - 1 - Tx^2}{Dx}$$

is operated in step 5i to obtain the value of B12, and the processing sequence is returned.

On the other hand, if the gain in step 5c is less than "0", the Equation $$1 + K \cdot \frac{Tx}{Q} + Tx^2$$

is operated in step 5j to obtain the value of Dx, and the Equation $$\frac{1 + \frac{Tx}{Q} + Tx^2}{Dx}$$

is operated in step 5k to obtain the value of A10. The value of A11 is obtained by operating the Equation $$\frac{2Tx^2 - 2}{Dx}$$

in step 5l. Then, the Equation $$\frac{1 - \frac{Tx}{Q} + Tx^2}{Dx}$$

is operated in step 5m to obtain the value of A12, and the value of A11 obtained in step 5l is caused to take the negative sign in step 5n to produce the value of B11. Finally, the Equation $$\frac{K \cdot \frac{Tx}{Q} - 1 - Tx^2}{Dx}$$

is operated in step 5o to obtain the value of B12, and the processing sequence is returned.

As stated above, the present invention provides a digital audio equalizer with high freedom that employs a digital signal processor for carrying out digital filter function to make equalization, so that its characteristics are considerably improved compared to the analog audio equalizer, and the user may arbitrarily change the characteristics.

What is claimed is:

1. A digital audio equalizer, comprising:
   means for providing a first digital audio signal;
   digital interface receiver means for demodulating an input digital audio signal into a second digital audio signal;
   signal input select switch means for selecting one of said first digital audio signal and said second digital audio signal to generate a selected digital audio signal;
   digital signal processor means for digitally equalizing said selected digital audio signal to generate a equalized digital audio signal, comprising a dampening multiplier for dampening said selected digital audio signal to generate a dampened digital audio signal, and a plurality of cascaded secondary infinite impulse response filters for filtering said dampened digital audio signal, each said cascaded secondary infinite impulse response filters being programmed to filter with a chosen gain, a chosen quality factor, and a chosen center frequency in response to a first value, a second value, a third value, a fourth value, and a fifth value as a function of a sampling frequency, said chosen center frequency, said chosen gain, and said chosen quality factor, each of said cascaded secondary infinite impulse response filters comprising:
   first multiplier means for multiplying said dampened digital audio signal by said first value to generate a first multiplier signal,
   first delay means for delaying said dampened digital audio signal by one sample to generate a first delay signal,
   second multiplier means for multiplying said first delay signal by said second value to generate a second multiplier signal,
   second delay means for delaying said dampened digital audio signal by two samples to generate a second delay signal,
   third multiplier means for multiplying said second delay signal by said third value to generate a third multiplier signal,
   Adder means for generating an adder signal,
   third delay means for delaying said adder signal by one sample to generate a third delay signal,
   fourth multiplier means for multiplying said third delay signal by a fourth value to generate a fourth multiplier signal,
   fourth delay means for delaying said adder signal by two samples to generate a fourth delay signal,
   fifth multiplier means for multiplying said fourth delay signal by a fifth value to generate a fifth multiplier signal, and
   said adder means for adding said first multiplier signal, said second multiplier signal, said third multiplier signal, said fourth multiplier signal, said fifth multiplier signal to generate said adder signal; and
   microcomputer means for controlling said digital signal processor means;
   wherein said first value, said second value, said third value, said fourth value, and said fifth value are determined for each of said cascaded secondary infinite impulse response filters by the following equations if said chosen gain is greater than zero:

$D_x = 1 + T_x/Q + T_x^2$, wherein:
said first value $=(1+K \cdot T_x/Q+T_x^2)/D_x$,
said second value $=(2 \cdot T_x^2-2)/D_x$,
said third value $=(1-K \cdot T_x/Q+T_x^2)/D_x$, said fourth value = $-(2 \cdot T_x^2 - 2)/D_x$,
said fifth value = $(-1 + T_x/Q - T_x^2)/D_x$, and
wherein:

$T_x$ is the TAN ($\pi \cdot$(chosen center frequency/sampling frequency));

K is said chosen gain expressed in decibels; and

Q is said chosen quality factor.

2. A digital audio equalizer, comprising;

means for providing a first digital audio signal;

digital interface receiver means for demodulating an input digital audio signal into a second digital audio signal;

signal input select switch means for selecting one of said first digital audio signal and said second digital audio signal to generate a selected digital audio signal;

digital signal processor means for digitally equalizing said selected digital audio signal to generate a equalized digital audio signal, comprising a dampening multiplier for dampening said selected digital audio signal to generate a dampened digital audio signal, and a plurality of cascaded secondary infinite impulse response filters for filtering said dampened digital audio signal, each said cascaded secondary infinite impulse response filters being programmed to filter with a chosen gain, a chosen quality factor, and a chosen center frequency in response to a first value, a second value, a third value, a fourth value, and a fifth value as a function of a sampling frequency, said chosen center frequency, said chosen gain, and said chosen quality factor, each of said cascaded secondary infinite impulse response filters comprising:

first multiplier means for multiplying said dampened digital audio signal by said first value to generate a first multiplier signal, first delay means for delaying said dampened digital audio signal by one sample to generate a first delay signal, second multiplier means for multiplying said first delay signal by said second value to generate a second multiplier signal, second delay means for delaying said dampened digital audio signal by two samples to generate a second delay signal, third multiplier means for multiplying said second delay signal by said third value to generate a third multiplier signal, Adder means for generating an adder signal, third delay means for delaying said adder signal by one sample to generate a third delay signal, fourth multiplier means for multiplying said third delay signal by a fourth value to generate a fourth multiplier signal, fourth delay means for delaying said adder signal by two samples to generate a fourth delay signal, fifth multiplier means for multiplying said fourth delay signal by a fifth value to generate a fifth multiplier signal, and said adder means for adding said first multiplier signal, said second multiplier signal, said third multiplier signal, said fourth multiplier signal, said fifth multiplier signal to generate said adder signal; and microcomputer means for controlling said digital signal processor means;

wherein said first value, said second value, said third value, said fourth value, and said fifth value are determined for each of said cascaded secondary infinite impulse response filters by the following equations if said chosen gain is less than zero:

$$D_x = 1 + K \cdot T_x/Q + T_x^2$$

wherein
said first value = $(1 + T_x/Q + T_x^2)/D_x$,
said second value = $(2 \cdot T_x^2 - 2)/D_x$,
said third value = $(1 - T_x/Q + T_x^2)/D_x$,
said fourth value = $-(2 \cdot T_x^2 - 2)/D_x$, and
said fifth value = $(-1 + K \cdot T_x/Q - T_x^2)/D_x$, and
wherein:

$T_x$ is the TAN ($\pi \cdot$(chosen center frequency/sampling frequency));

K is said chosen gain expressed in decibels; and

Q is said chosen quality factor.

3. A digital audio equalizer as claimed in claim 1, wherein said plurality of cascaded secondary infinite impulse response filters consists of three secondary infinite impulse response filters.

4. A digital audio equalizer as claimed in claim 3, wherein said third delay means of said first secondary infinite impulse response filter is said first delay means of said second secondary infinite impulse response filter.

5. A digital audio equalizer as claimed in claim 1, wherein values for $T_x$ are stored in ROM in said microcomputer means for combinations of said sampling frequency and said chosen center frequency.

6. A digital audio equalizer as claimed in claim 1, wherein said first value, said second value, said third value, said fourth value, and said fifth value are determined for each of said cascaded secondary infinite impulse response filters by the following equations if said chosen gain is less than zero:

$$D_x = 1 + K \cdot T_x/Q + T_x^2,$$

wherein
said first value = $(1 + T_x/Q + T_x^2)/D_x$,
said second value = $(2 \cdot T_x^2 - 2)/D_x$,
said third value = $(1 - T_x/Q + T_x^2)/D_x$,
said fourth value = $-(2 \cdot T_x^2 - 2)/D_x$, and
said fifth value = $(-1 + K \cdot T_x/Q - T_x^2)/D_x$, and
wherein:

$T_x$ is the TAN ($\pi \cdot$(chosen center frequency/sampling frequency));

K is said chosen gain expressed in decibels; and

Q is said chosen quality factor.

7. A digital audio equalizer as claimed in claim 2, wherein said first value, said second value, said third value, said fourth value, and said fifth value are determined for each of said cascaded secondary infinite impulse response filters by the following equations if said chosen gain is greater than zero:

$$D_x = 1 + T_x/Q + T_x^2,$$

wherein:
said first value = $(1 + K \cdot T_x/Q + T_x^2)/D_x$,
said second value = $(2 \cdot T_x^2 - 2)/D_x$,
said third value = $(1 - K \cdot T_x/Q + T_x^2)/D_x$,
said fourth value = $-(2 \cdot T_x^2 - 2)/D_x$,
said fifth value = $(-1 + T_x/Q - T_x^2)/D_x$, and
wherein:

$T_x$ is the TAN ($\pi \cdot$(chosen center frequency/sampling frequency));

K is said chosen gain expressed in decibels; and

Q is said chosen quality factor.

8. A digital audio equalizer as claimed in claim 2, wherein said plurality of cascaded secondary infinite impulse response filters comprise first, second and third secondary infinite impulse response filters.

9. A digital audio equalizer as claimed in claim 8, wherein said third delay means of said first secondary infinite impulse response filter is said first delay means for a second secondary infinite impulse response filter.

10. A digital audio equalizer as claimed in claim 2, wherein values for $T_x$ are stored in ROM in said microcomputer means for combinations of said sampling frequency and said chosen center frequency.

* * * * *

UNITED STATES PATENT AND TRADEMARK OFFICE
CERTIFICATE OF CORRECTION

PATENT NO. : 5,195,141
DATED : 16 March 1993
INVENTOR(S) : Seong-Cheol Jang

It is certified that error appears in the above-indentified patent and that said Letters Patent is hereby corrected as shown below:

Column 2,

Line 23,     change "witch" to --switch--;

Column 3,

Line 16,     change "$A_{22}$" to --$A_{32}$--;

Signed and Sealed this

Twenty-third Day of August, 1994

Attest:

BRUCE LEHMAN

*Attesting Officer*      *Commissioner of Patents and Trademarks*